(12) United States Patent
Lindemann et al.

(10) Patent No.: US 10,511,296 B2
(45) Date of Patent: Dec. 17, 2019

(54) SYSTEM AND METHOD FOR MODULATION AND DEMODULATION

(71) Applicant: PR ELECTRONICS A/S, Rønde (DK)

(72) Inventors: Stig Alnøe Lindemann, Højbjerg (DK); Dan Vinge Madsen, Risskov (DK)

(73) Assignee: PR Electronics A/S, Rønde (DK)

( * ) Notice: Subject to any disclaimer, the term of this patent is extended or adjusted under 35 U.S.C. 154(b) by 319 days.

(21) Appl. No.: 15/502,246

(22) PCT Filed: Jul. 1, 2015

(86) PCT No.: PCT/DK2015/050194
§ 371 (c)(1),
(2) Date: Feb. 7, 2017

(87) PCT Pub. No.: WO2016/019964
PCT Pub. Date: Feb. 11, 2016

(65) Prior Publication Data
US 2017/0237420 A1   Aug. 17, 2017

(30) Foreign Application Priority Data

Aug. 8, 2014   (DK) .................................. 2014 70475

(51) Int. Cl.
*H03K 7/08*     (2006.01)
*H03F 3/217*    (2006.01)
*H04L 27/10*    (2006.01)
*H04L 12/10*    (2006.01)
(Continued)

(52) U.S. Cl.
CPC .............. *H03K 7/08* (2013.01); *H03F 3/217* (2013.01); *H03F 3/2173* (2013.01); *H03K 9/08* (2013.01);
(Continued)

(58) Field of Classification Search
CPC .......... H03K 9/08; H03K 7/08; H03K 17/691; H04L 27/10; H04L 12/10; H02M 3/33523;
(Continued)

(56) References Cited

U.S. PATENT DOCUMENTS 4,843,339 A  *  6/1989  Burt ...................... C08F 220/04
                                                          327/94
5,748,045 A     5/1998  Tateishi
(Continued)

FOREIGN PATENT DOCUMENTS

GB         2247120       2/1992
GB         2493798       2/2013
(Continued)

*Primary Examiner* — Arnold M Kinkead
(74) *Attorney, Agent, or Firm* — Dykema Gossett PLLC

(57) ABSTRACT

The present invention relates to a system and a method for pulse width modulation and demodulation of a continuous input signal, which system is configured to receive a continuous input to an analog modulator, which system comprises a demodulator generating a continuous output signal. It is the object of the pending patent application to use an analog modulator for transmitting the signal from the input stage over to an output stage. A further object of the pending patent application is to preserve the signal integrity in regard to precision and to minimize both non-linearities and distortion side effects. The object can be fulfilled by the analog modulator being formed as a composite phase modulator which composite phase modulator comprises at least one feedback loop which feedback loop determines the width of a low-level discrete signal, which composite phase modulator comprises at least one feed-forward loop, which feed-forward loop determines the width of a high-level discrete signal as a function of the continuous input. Hereby it can be achieved that timing between discrete low-level and high-level forms a discontinuous output signal representing the continuous input.

19 Claims, 20 Drawing Sheets

(51) Int. Cl.
*H04B 1/16* (2006.01)
*H03K 9/08* (2006.01)

(52) U.S. Cl.
CPC ............... *H04B 1/16* (2013.01); *H04L 12/10* (2013.01); *H04L 27/10* (2013.01)

(58) Field of Classification Search
CPC .... H02M 1/08; H01F 19/08; H01F 2019/085; H04B 1/16; H03F 3/217; H03F 3/2173
USPC ......... 375/271, 259; 327/94; 330/10, 207 A; 437/60
See application file for complete search history.

(56) References Cited

U.S. PATENT DOCUMENTS

| | | |
|---|---|---|
| 7,301,393 B2 | 11/2007 | Candy |
| 7,965,141 B2 | 6/2011 | Dooper et al. |
| 2004/0095103 A1 | 5/2004 | Kernahan |
| 2009/0072902 A1 | 3/2009 | Cox |
| 2010/0214143 A1 | 8/2010 | Nakamoto |
| 2011/0068864 A1 | 3/2011 | Putzeys |
| 2012/0032718 A1 | 2/2012 | Chan et al. |
| 2013/0051092 A1 | 2/2013 | Cooper et al. |
| 2014/0328427 A1* | 11/2014 | Chang .................... H04L 27/10 375/271 |

FOREIGN PATENT DOCUMENTS

| | | |
|---|---|---|
| WO | 8202300 | 7/1982 |
| WO | 2008064348 | 5/2008 |

* cited by examiner

SYSTEM AND METHOD FOR MODULATION AND DEMODULATION

FIELD OF THE INVENTION

The present invention relates to a system and a method for modulation and demodulation of a continuous input signal, which system is configured to receive a continuous input and by a composite phase modulator to generate a pulse-width modulated (PWM) discontinuous signal, which system comprises a PWM demodulator for generating a continuous output signal.

BACKGROUND OF THE INVENTION

Pulse Width Modulators are widely used and a well-known technique used for various purposes; one of these is conversion of a signal intended for signal transfer.

Patent No. EP0077332, filed on Dec. 28, 1981, discloses a Pulse Width Modulation Decoder, which enables a PWM demodulation to have a full direct current settling within one period of the PWM signal. The requirement for the full settling given the technology disclosed within EP0077332 is that the demodulation circuit is exactly matched to the PWM frequency and thereby gives a requirement of having a PWM modulator, which sampling frequency is stable and non-dependent of the continuous input signal.

Self-oscillating PWM designs are typically challenged by not having a fixed modulation/sampling frequency, the sampling frequency being very dependent on both the frequency components and the amplitude of the continuous input signal, which can lead to harmonic distortion and non-linearity due to channel distortion and lack of synchronization between PWM modulator and demodulator.

OBJECT OF THE INVENTION

It is the object of the pending patent application to use an analog composite phase modulator whose fixed frequency in combination with instantaneous DC settling within one period of the sampling frequency ensures that a continuous signal can be passed from the input stage over to a continuous signal at the output stage with a minimum of non-linearities and distortion across either an isolation barrier or along a digital transmission line.

A further object of the pending patent application is to achieve a precise high speed conversion of continuous signals into pulse-width modulated discontinuous signals (PWM) which PWM signals are to be transmitted to a precise high-speed demodulator.

An additional object of the pending patent application is to preserve the signal integrity with regard to direct current precision, amplitude and phase by minimizing both non-linarites and distortion side effects in the modulation and demodulation processes.

DESCRIPTION OF THE INVENTION

The object can be fulfilled by a system as disclosed in the preamble to claim 1 and further modified in that the continuous to discontinuous pulse width converter is formed as a composite phase modulator, which composite phase modulator comprises at least one feed-forward loop, which feed-forward loop determines the timing length of a high-level discontinuous signal, which composite phase modulator comprises at least one feedback loop which feedback loop determines the timing length of a low-level discontinuous signal as a function of the continuous input.

The present patent discloses a technique, which ensures a stable PWM modulation/sampling frequency, which is independent of the frequency content and amplitude of the continuous signal.

Hereby it can be achieved that any continuous signal, even signals with frequencies in the vicinity of the Nyquist frequency (half the sampling frequency), can be converted into pulse-width modulated signals, which signals represent the content of the continuous input signal. This pulse-width modulated signal can hereafter be transmitted by any communication line. By an efficient high-speed demodulator this PWM signal can restore the original continuous signal.

This can be very important if continuous signals are used for technical measurement, for example in harsh environments, where noise influence at the continuous signals over long transmission lines will have a major impact on the content of the continuous signals. Here it is very important that the signal is converted into a pulse-width modulated signal because this pulse-width modulated signal can be converted back into the original signal by signal processing.

The modulator converts a bandwidth-limited input signal $V_{in}(t)$ by the use of a carrier frequency determined by the design of the modulator. By converting the continuous input signal to a PWM signal, the DC integrity of the signal is determined by the phase resolution. Group delay distortion affects the DC precision and is the reason why change in the modulation frequency must be avoided in order to minimize non-linearities and down conversion of the modulation frequency itself into the input signal band (e.g. AC to DC). The non-inverting version of the concept with the DC precision and signal integrity is ensured by the use of an integrator.

In a preferred embodiment for the invention the system can comprise a galvanic isolation between the modulator and the demodulator. In order to protect technical systems it can be necessary to transmit the modulated signals over a galvanic isolation because the signals coming from the DC input can be measuring signals coming from a very harsh environment where high-level pulses may occur, and in order to reduce the influence of wire-conducted noise it is very important that a galvanic isolation is performed between the receiving part of a technical measuring system and the system that performs further signal treatment such as a computer system. Galvanic isolations are often used in all communication systems where long lines are used, and there is a risk that different cables are crossing each other and signal cables are maybe placed in parallel or are crossing high voltage lines which can have some influence at the relatively weak continuous signals. Another risk is simply that lightning can have influence at any signal lines where protection against lightning can be made in various other protection systems but ending always in a galvanic isolation. Different kinds of galvanic isolations exist for example transformers, opto-couplers and communication over optical fibres.

Additional signal conditioning can be applied in the feedback path in order to ensure signal conversion integrity. An example could be the use of a temperature-stable, high-precision voltage reference with high and low level matched output impedance. This would contribute to a design with minimal non-linearity. Hereby a much more precise and distortion-free conversion of continuous to discontinuous signals can be achieved. The signal conditioning can be an active filter that filters away all high frequencies, or in other situations, the opposite is also possible where the signal condition is filtering all low frequencies. In this way, by having influence on the actual feedback, it is possible to obtain total influence at the feedback loop, and by designing the signal condition circuit many other non-disclosed possibilities will exist by this method for modulation.

In a further preferred embodiment for the invention a negative input at an integrator can form a summing point for the continuous input and the feedback regulation loop for forming an inverting PWM modulator. In this case the signal conditioning is also used as level shift and pulse polarity in order to provide PWM output $V_{out}$ signal which has the opposite polarity of the input signal.

In a further preferred embodiment for the invention the signal condition circuit can be formed by the use of the discontinuous output signal to control a switch, which switch switches between a high level and a low level of a high-precision voltage reference. Hereby implementation of signal conditioning in the feedback path can be achieved, thereby inverting modulator setup. In this instance a continuous SPDT switch is utilized in combination with a high-precision voltage reference $V_{ref}$. In this way, where the actual discontinuous output signal is only used for a switching control, it is achieved that absolutely none of the discontinuous noise signals that can occur, e.g. high-frequency distortion is totally avoided because the feedback signal is a simple switching between two very precise DC levels. Hereby the feedback will be an almost totally correct representation of the discontinuous output, but now perfectly shaped.

In a further preferred embodiment for the invention the continuous input can pass a sample and hold circuit. Hereby it can be achieved that distortion and high harmonics, which are inherent in continuous PWM modulators, can be eliminated. In the composite phase modulator harmonic distortion occurs due to change of the input $V_{in}$ during the generation of pulse-pause set. A method of minimizing this type of harmonic distortion would be to sample and hold the input to the modulator. This modification to the modulator concept ensures that no changes in the input signal to the composite phase modulator occurs during a pulse and pause generation, hence minimization of harmonic generation is obtained.

In a further preferred embodiment for the invention the feed-forward circuitry can comprise a feed-forward path phase compensation of the inverting composite phase modulator. Hereby a continuous means of phase compensation between the pulse width circuitry and the pause width circuitry can be introduced. This phase compensation mimics to some extent the effect of the discrete sampling in the feed-forward loop. By changing the phase of the continuous input it is possible by the feed-forward function to change the timing of the signal and in that way achieve control of a delay during the feed-forward. Some delay in a feed-forward regulation can be necessary in order to ensure additional regulations in the case that the feedback regulation has a small delay for each component which the signal is passing. Therefore, the feed-forward signal has to be delayed in some way; otherwise the feed-forward signal will influence the output signal before any feedback signal has reached the same position in the logic or continuous regulation.

In a further preferred embodiment for the invention, the feedback regulation loop can comprise a path phase compensation of the inverting composite phase modulator. Hereby it can be achieved that there is performed a phase compensation of the input to the mixing point between the input width phase correction and the feedback signal which is further sent to the negative input of the integrator. This phase change of the continuous input to the summing point can give a delay for the whole feedback loop where continuous input signals to the feed-forward loop are not passing the phase compensation device.

In a further preferred embodiment for the invention the feed-forward circuitry can comprise a feed-forward path phase compensation of the non-inverting composite phase modulator. Hereby it is possible to obtain at least the same effect as the one previously disclosed where the phase compensation between the integrator circuitry and the pulse width circuitry can be adjusted by this phase compensation.

In a further preferred embodiment for the invention, the feedback regulation loop can comprise a feedback path phase compensation of the non-inverting composite phase modulator. Hereby it can be achieved that a phase change of the continuous input is performed before the continuous input is sent to the positive input of the integrator where the negative input at this integrator is the traditional feedback loop. This leads to a situation where phase compensation can be performed at the input to the integrator part of the converter.

In a further preferred embodiment for the invention the feed-forward loop can comprise an SR-latch as control logic to interpret the pulse and pause width control signals, which pulse width is determined by comparing the continuous input signal with a constant slope signal voltage ramp generator, which voltage ramp generator is initiated by the pause regulation loop when the value of the slope matches the input voltage, and the output of the comparator is used to end the pulse and start the pause while also resetting the voltage ramp generator. Hereby the pulse width can be determined by comparing the input signal with the constant slope signal of the voltage ramp generator which is initiated by the pause regulation loop. When the value of the slope matches the input voltage, the output of the comparator is used to end the pulse and start the pause while also resetting the ramp generator. In this instance, the pause regulation circuitry is built around an integrator where an SR-latch is used as control logic to interpret the pulse and pause width control signals.

In a further preferred embodiment for the invention a microprocessor can perform actual control of a plurality of voltage reference sources. Hereby means for linearizing the modulator can be realized by using e.g. a microcontroller in combination with some additional continuous signal conditioning. By insertion of controllable voltage sources or a combination of several sources, these sources can be used for calibration of offset, gain and tuning of oscillation frequency. This can be used for further optimization which compensates for non-ideal effects in components which causes a shift in modulation frequency. A method for this would be a regulated surveillance of the oscillation frequency e.g. a phase-locked loop (PLL).

In a further preferred embodiment for the invention the demodulator can be based on an integrator and a sample-hold circuitry for generating a continuous output signal. As an example, the modulator can be combined with a demodulator based on an integrator and a sample-hold circuitry. An advantage of combining this type of demodulator with the composite phase modulator is that the demodulator sample-hold circuitry locks onto the PWM signal and not to a fixed frequency. This is important in regard to minimizing harmonic generation. The modulator converts a continuous signal into a discrete-like discontinuous signal set of a positive and a negative phase such as a pulse width and a pause width. The demodulator converts the matching positive and negative phase. Hereby it can be achieved that the signals used for conversion from discontinuous to continuous are signals that are very precise in shape simply because only the timing is used for the pulse width modulation so that the switching is perfect in relation to the signal that is received, but any noise that could occur as part of the PWM modulation is reduced in this way.

In a further preferred embodiment for the invention, the sample-hold circuitry can comprise a switch which switches between a high level and a low level of a second high-precision voltage reference.

In a further preferred embodiment for the invention, the sample-hold circuitry can comprise a further integrator from which integrator a feedback signal is connected to the negative input at the integrator which integrator has an output connected to a first terminal of a switch, which integrator has a negative input connected to a second terminal of the switch, which switch comprises a third terminal connected through a capacitor to ground. Hereby it can be achieved that when the signal has passed the first integrator, this signal is used for charging the capacitor. After switching the switch, the charge on the capacitor is used as a negative input to the next integrator. Hereby it is achieved that no high frequencies can be transmitted because the charge of a capacitor contains no AC frequencies. In the same way it is avoided that there is any connection between the first and the second integrator in the forward direction. Instead there is a common feedback. In this way it is achieved that the continuous output signal is settled to the level of the PWM signal within one period of the PWM signal.

In a further preferred embodiment for the invention the composite phase modulator can be combined with a class D power circuitry to implement a self-oscillating class D power amplifier which exhibits very low non-linearities and low distortion.

The patent application further disclose a method for converting a continuous signal by a pulse width modulation into a discontinuous signal which discontinuous signal is transmitted through galvanic isolation or communication means whereby the method further performs converting discontinuous signal from galvanic isolation or the communication means by a demodulation circuit into a continuous output signal. Hereby it can be achieved that a continuous signal can be converted into a pulse-width modulated signal. This conversion is performed in an extremely fast and very precise way. After transmission over maybe a communication line or maybe over a galvanic isolation, this pulse-width modulated signal can be demodulated into a continuous signal which is an exact copy of the continuous signal that was started and sent into the composite phase modulator. By this method it is possible to achieve transmission of extremely fast operating continuous signals simply because the pulse width modulation is performed asynchronously, and the frequency of the pulse width modulation is independent of the frequency of the continuous signal. Also in the demodulation this process is performed with an automatic frequency adjustment so also the demodulation takes place as a self-oscillating system where the frequency is independent of the signal content of the signal that has to be converted.

In the pending patent application the wording "continuous signal" is used for any analog signal which analog signal can comprise any variable DC signal or any oscillating AC signal or a combination of DC and AC signals.

The wording "discontinuous" is used for any signal having a first low discrete level and a second high discrete level, such as digital signals.

DETAILED DESCRIPTION OF THE INVENTION

Figure 1:
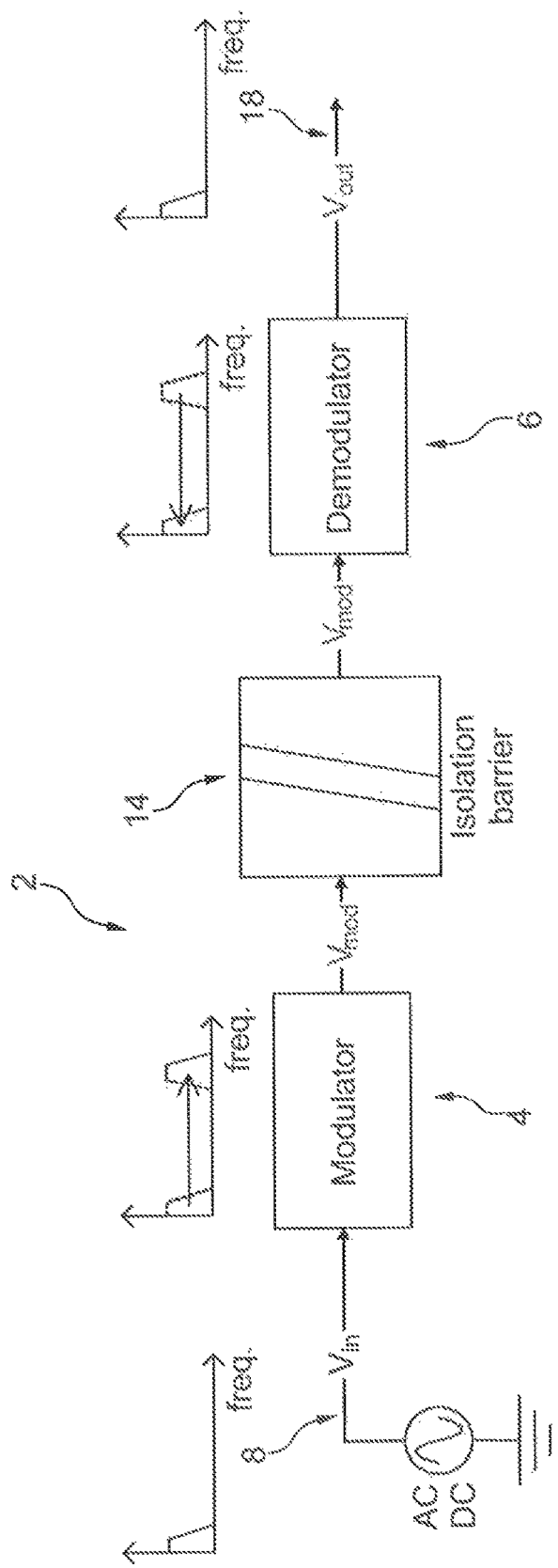
FIG. 1 discloses a system for signal modulation and demodulation.

FIG. 1 shows one possible embodiment for signal modulation and demodulation. FIG. 1 further shows a first curvature indicating the frequency bandwidth of the continuous input signal. It can be seen that the upper frequency is relatively low. At the next curvature it is indicated that the relatively low-frequency curve is converted into a curve at a much higher frequency. Further in the third curvature it is indicated that the high-frequency curve is converted into a low-frequency continuous signal which is clearly indicated at the fourth curvature. Further there is indicated a system 2 comprising a modulator 4 and a demodulator 6 where a continuous input line is indicated as 8, and where the continuous output is indicated as 18. Further, there is indicated an isolation barrier 14.

In operation, the continuous signal 8 will be converted in the modulator 4 into a pulse-width modulated signal. This signal is then transmitted maybe through an isolation barrier 14 as indicated, but instead the transmission can be performed at any discrete/digital communication line. The receive signal which could come from a communication line or from the isolation barrier 14 is demodulated in the demodulator 6 back into the continuous signal 18.

Figure 2:
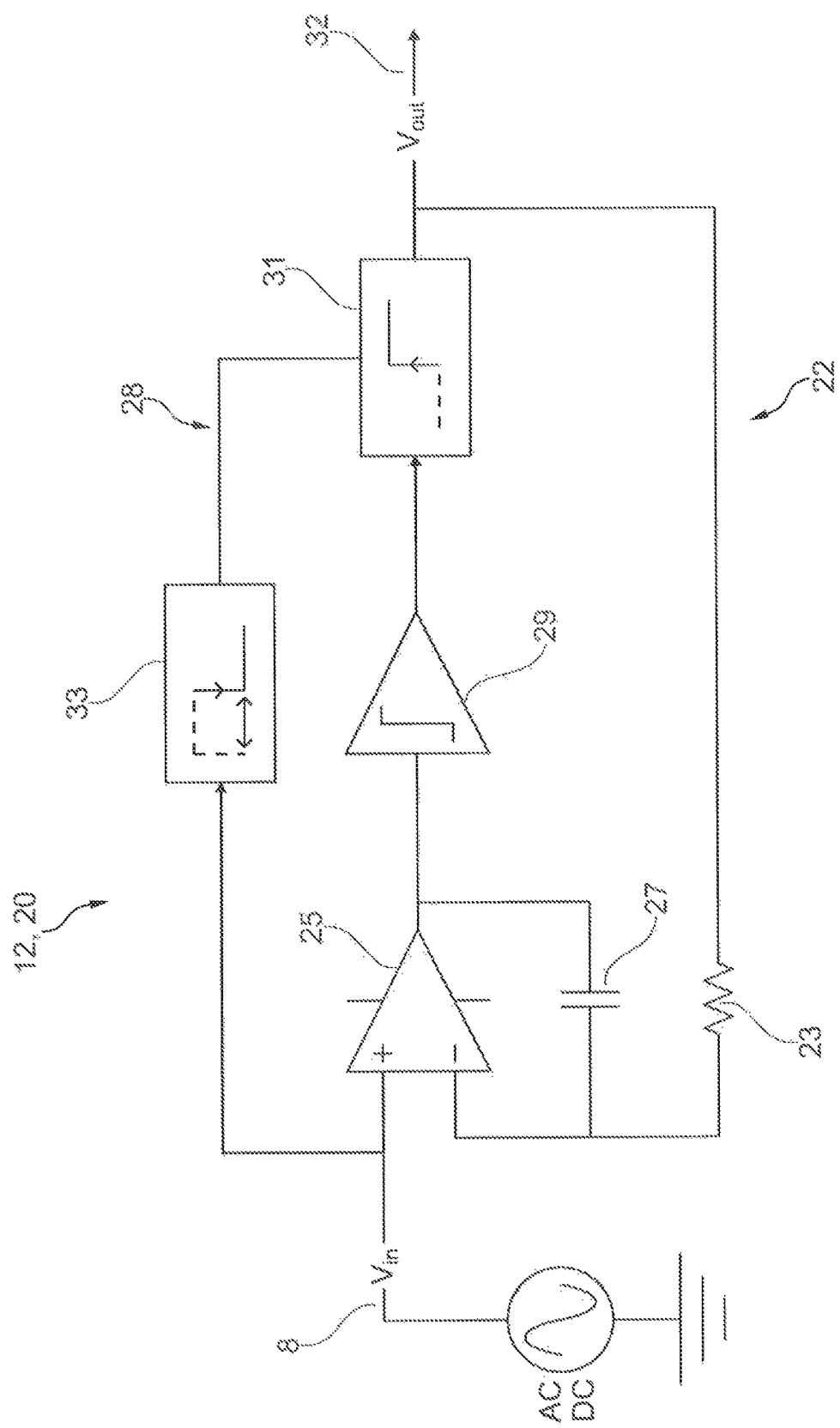
FIG. 2 discloses a non-inverting modulator.

FIG. 2 discloses a first possible embodiment for a composite phase modulator 20. This modulator 20 comprises a continuous input line 8, which input line 8 is connected to a feed-forward loop 12 and to the positive input of an operational amplifier 25. Together with a negative feedback capacitor 27 this operational amplifier 25 forms an integrator. The output of this integrator is transmitted further to a comparator 29 from which a discontinuous signal is sent to the pulse-shaping circuit 31. By feedback line 22 the output from the pulse-shaping circuit 31 passes a resistor 23 and is sent back to the negative input of the operational amplifier 25. The continuous input 8 is transmitted to pulse-shaping device 33 placed in the feed-forward loop 12 where the output from the feed-forward pulse-shaping device 33 is sent further to the pulse-shaping device 31. Hereby it is achieved that the feedback loop 22 generates the low pulse width of the pulse-width modulated signal that is generated where the feed-forward loop 12 generates the pulse width of the positive pulse.

Hereby an extremely fast operating pulse width modulation circuit is achieved.

Figure 3:
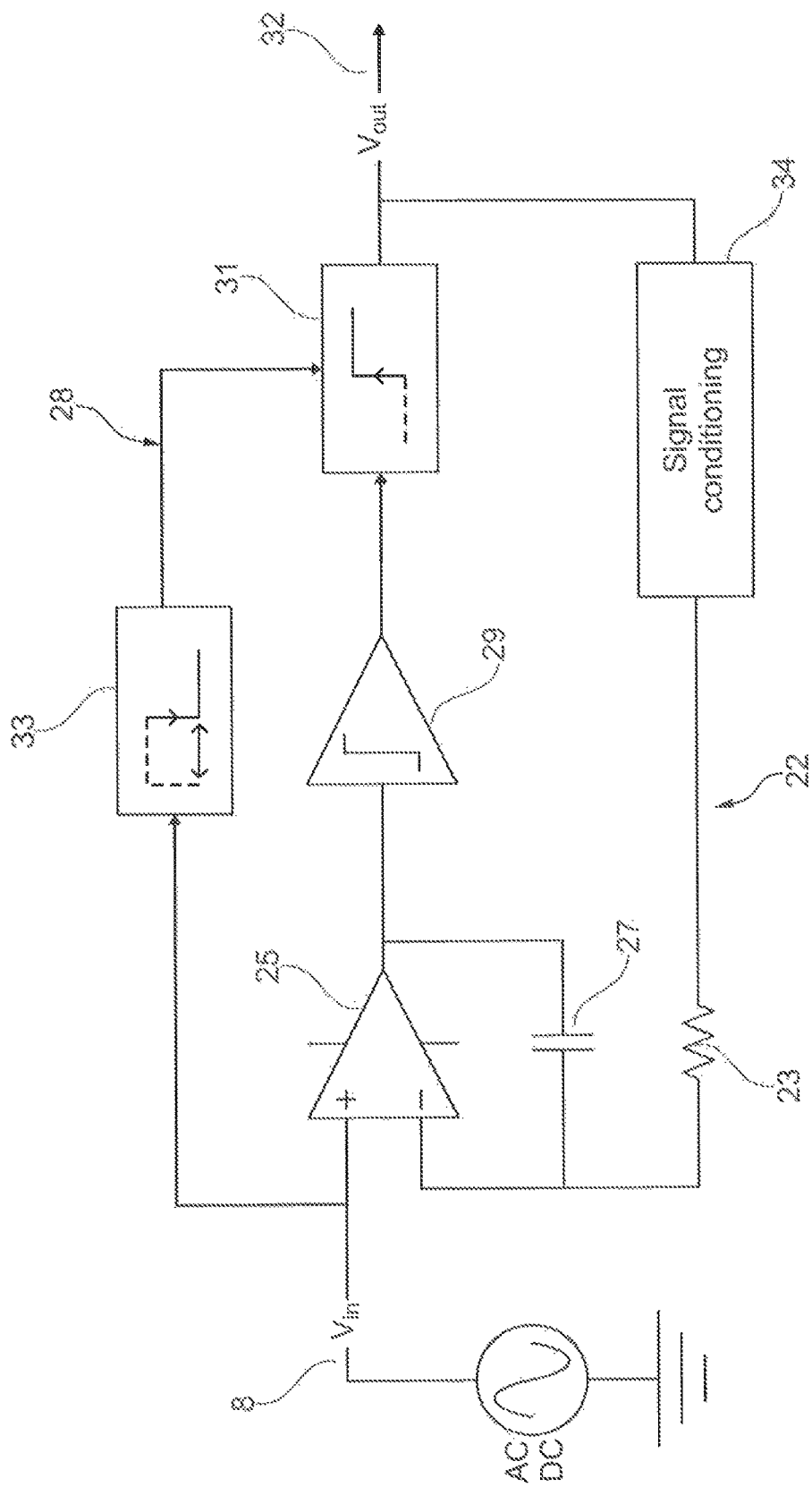
FIG. 3 discloses a possible embodiment for a non-inverting modulator with signal conditioning.

FIG. 3 more or less discloses the same embodiment as the one shown in FIG. 2. The only difference to FIG. 2 is that the feedback loop 22 now comprises a signal conditioning device 34.

Figure 4:
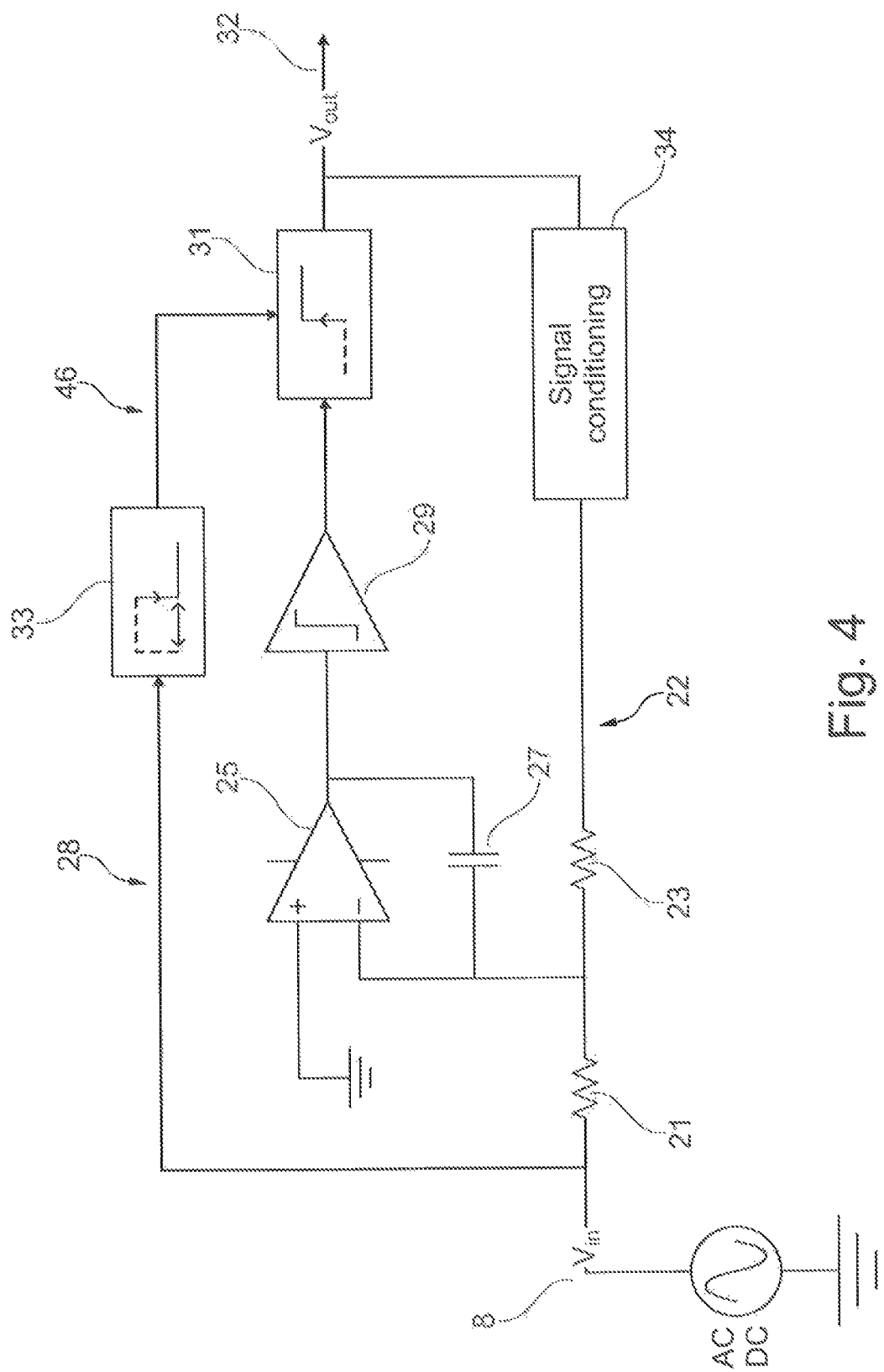
FIG. 4 discloses a non-inverting modulator with signal conditioning.

FIG. 4 discloses an inverting modulator with signal conditioning. FIG. 4 is different in that now both the input and the feedback signal are combined into a summing point between resistors 21, 23 into the negative input of the operational amplifier 25. Hereby an inverting modulator with signal conditioning is achieved, as the signal conditioning device 34 is still indicated in FIG. 4.

Figure 5:
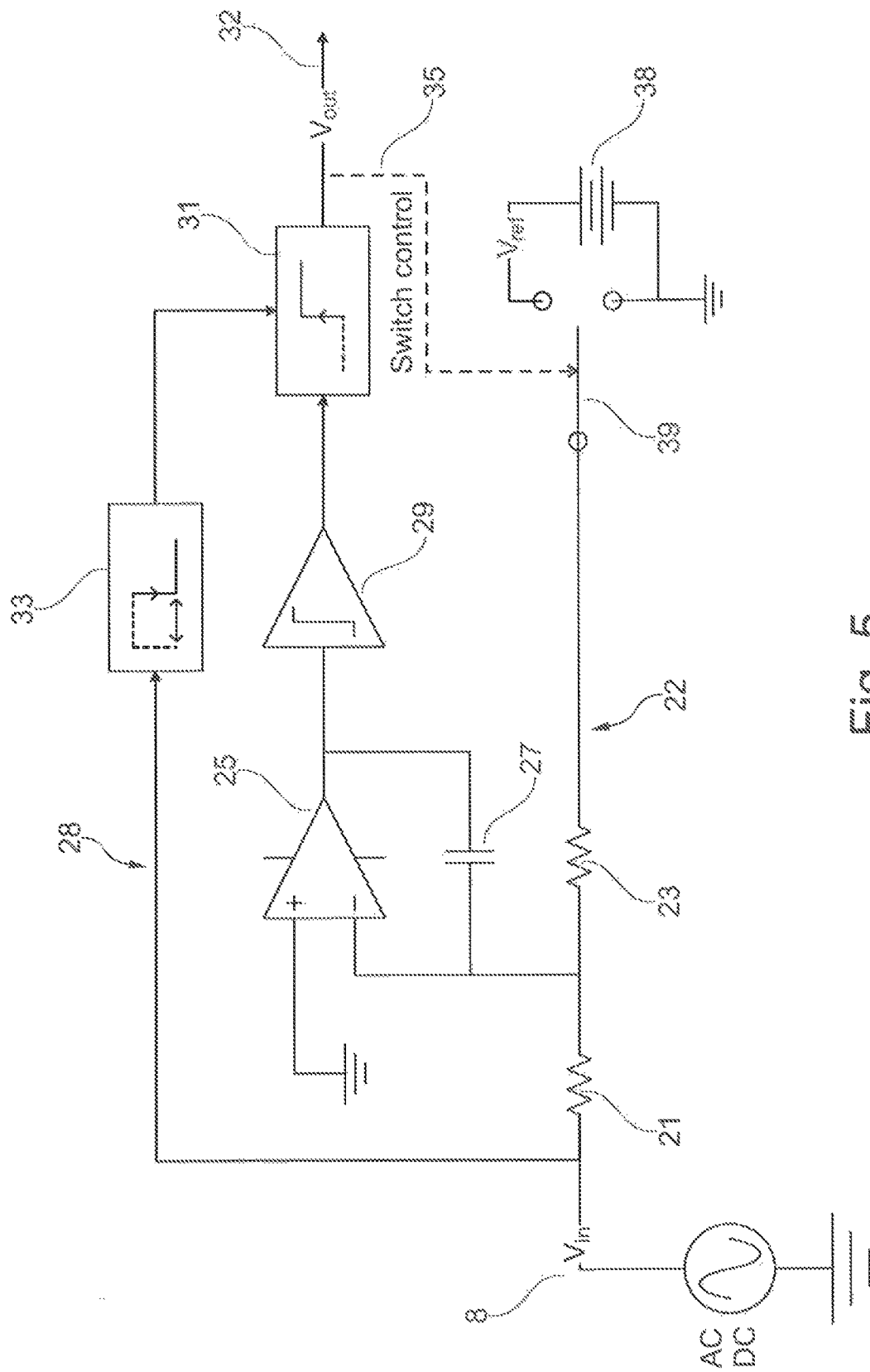
FIG. 5 discloses an example of the feedback signal conditioning in combination with the inverting modulator.

FIG. 5 discloses an example of the feedback signal conditioning in combination with the inverting modulator. FIG. 5 is different to FIG. 4 in that way that the signal condition is performed by a continuous SPDT-switch 39, which switch 39 by a switch control line 35 is forced to switch between two voltage levels of a high-precision power supply 38. In that way it can be achieved that the feedback signal is an absolute pure square-formed continuous signal where no noise generated by the conversion can take any part of the feedback loop.

Figure 6:
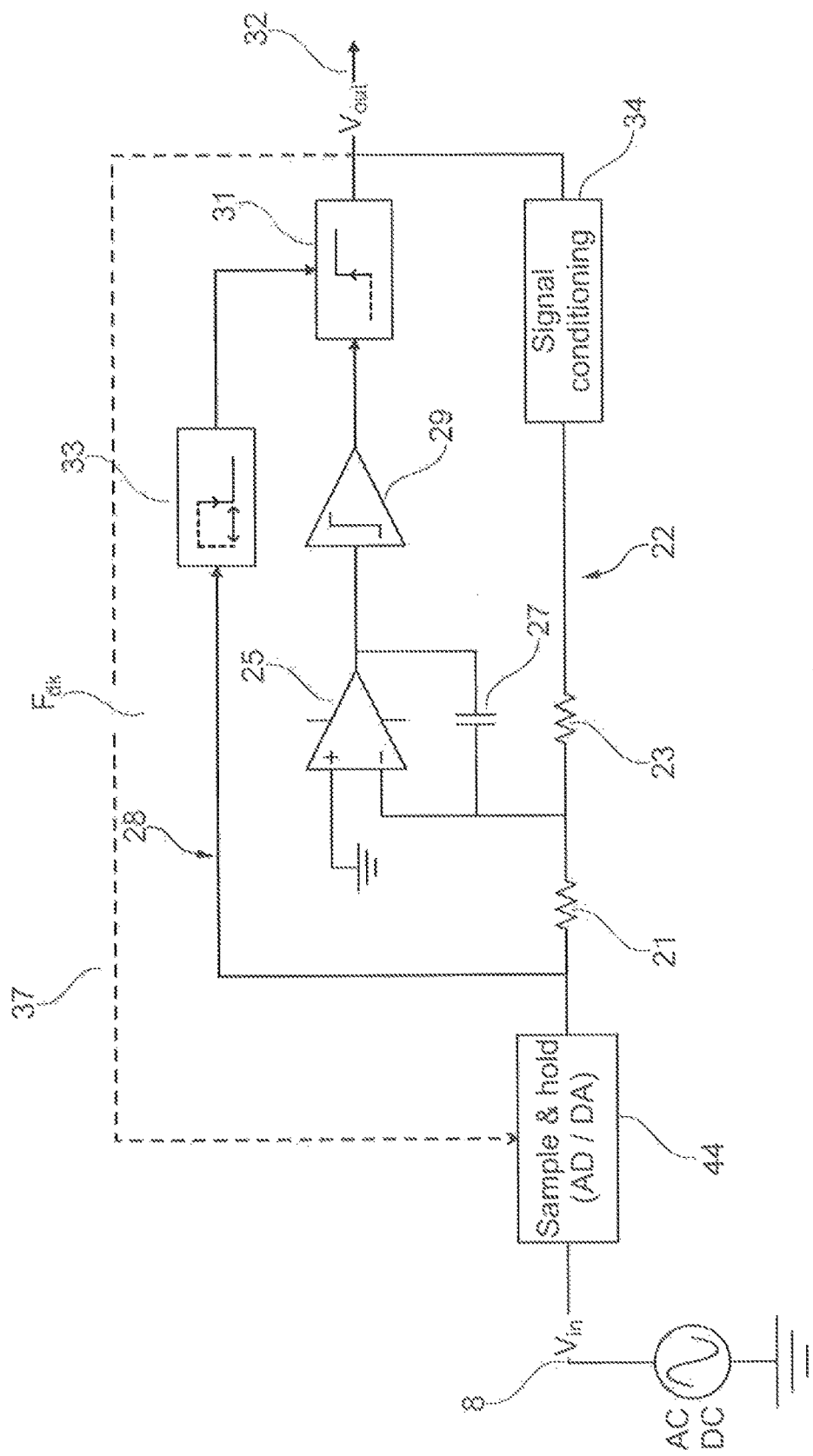
FIG. 6 discloses a possible embodiment for a sampled version of the modulator.

FIG. 6 discloses a sampled version of a modulator as disclosed in the previous figures. At first the continuous input 8 is sent to a sample and hold circuit 44. This sample and hold circuit is controlled by a signal 37 which is generated directly at the discontinuous output 32. In that way it can be avoided that any changes in the continuous input voltage during the digitalisation process will have any influence on the output 32, and in that way no fast oscillating signals can be generated and disturb the digitalisation process.

Figure 7:
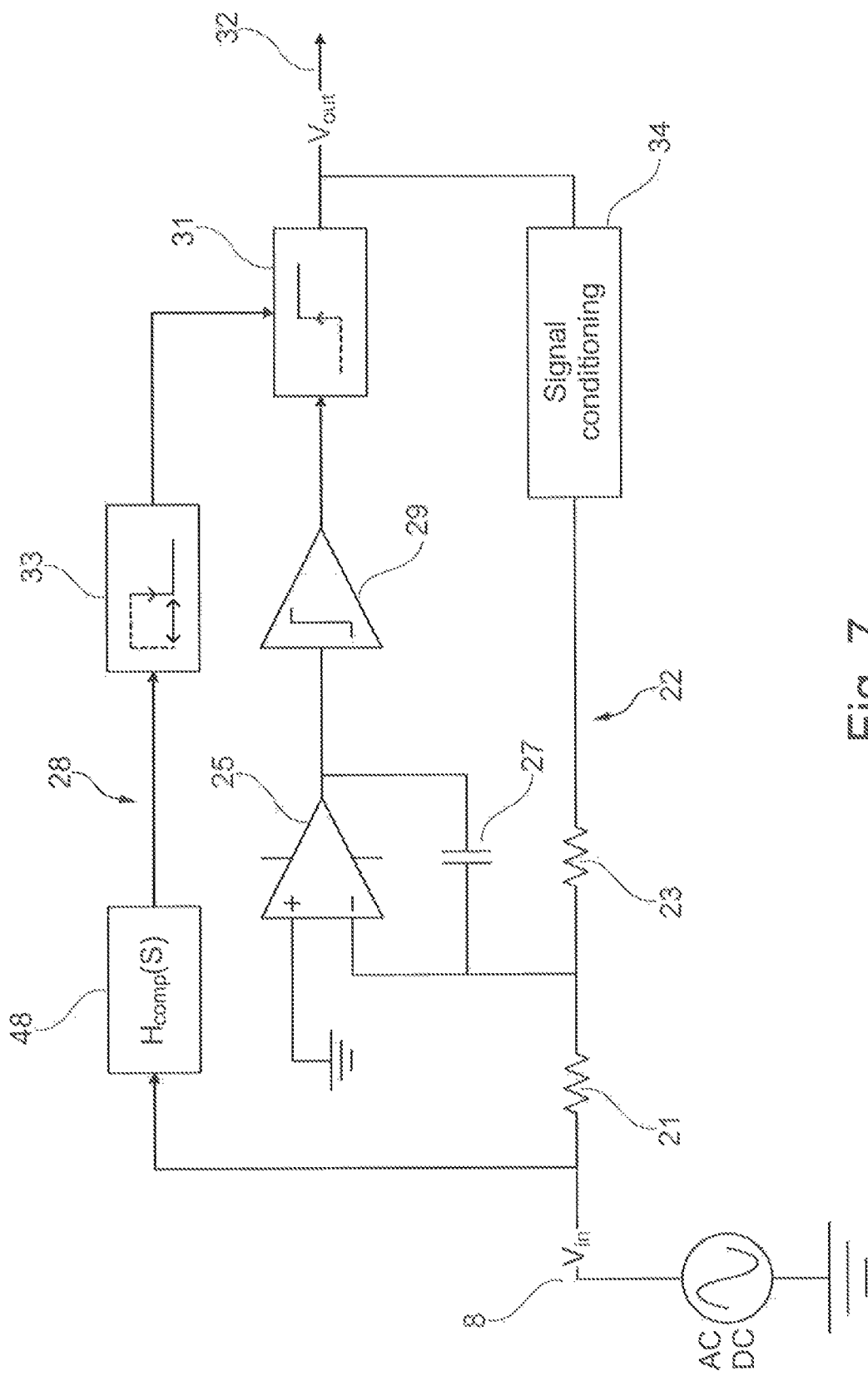
FIG. 7 discloses a possible embodiment for a forward path phase compensation of the inventing composite phase modulator.

FIG. 7 discloses a feed-forward path phase compensation of the inverting composite phase modulator. The feed-forward loop 28 now comprises a phase compensation device 48. By the phase change applied in the phase compensation device 48, it is possible to change the delay of the signals and compensate for the fact that the feed-forward loop 28 comprises further components for a signal to pass than does the feedback loop 22. By changing the phase by the device 48 it is possible to achieve a small delay in the feed-forward loop 28.

Figure 8:
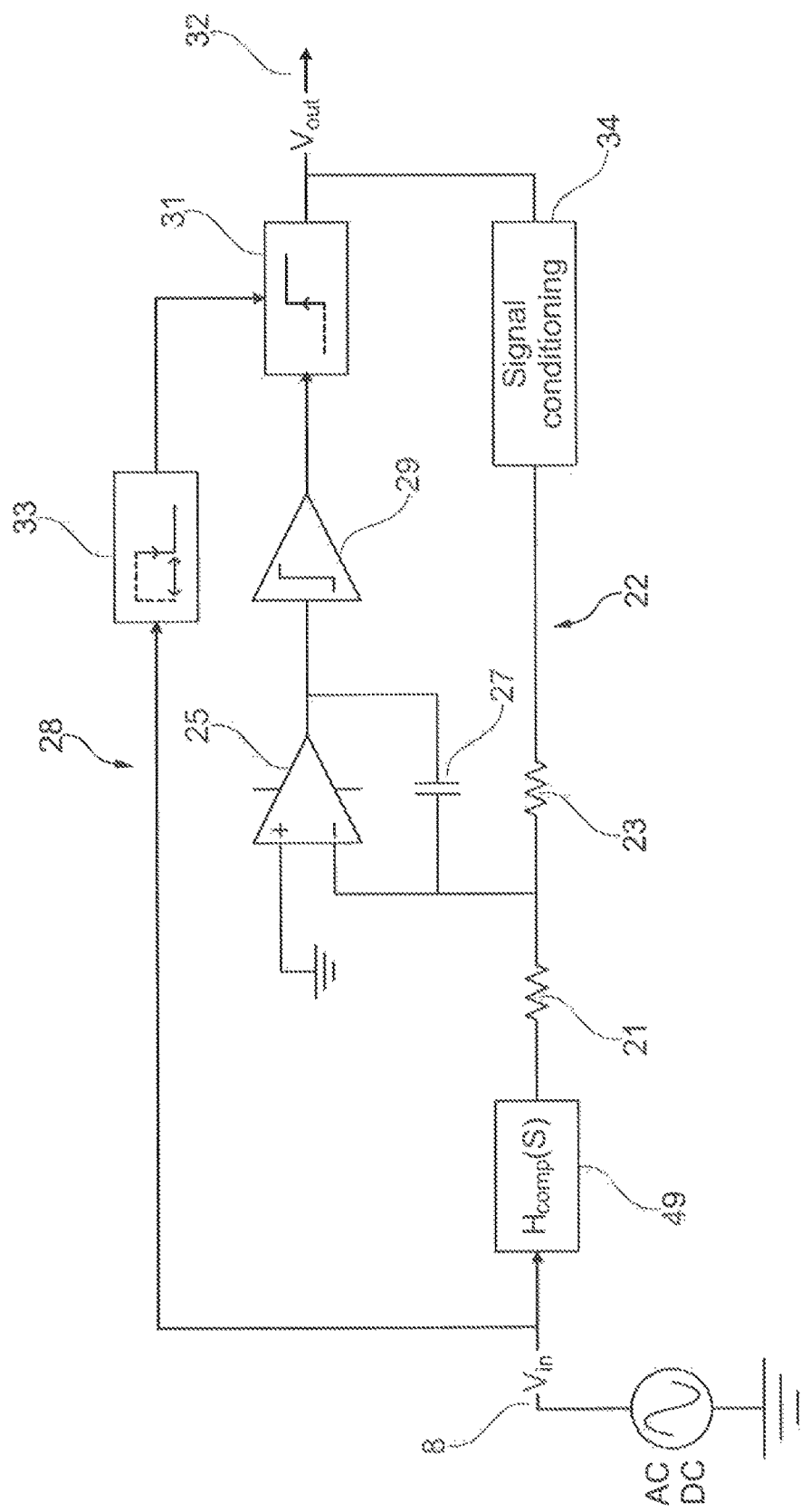
FIG. 8 discloses a feedback path phase compensation of the inventing composite phase modulator.

FIG. 8 discloses a feedback path phase compensation of the invented composite phase modulator. The phase compensation device 49 is placed in the continuous input line 8 which is sent to the summing point between the resistor 21 and the resistor 23. The feed-forward loop 28 receives the continuous input as previously described.

Figure 9:
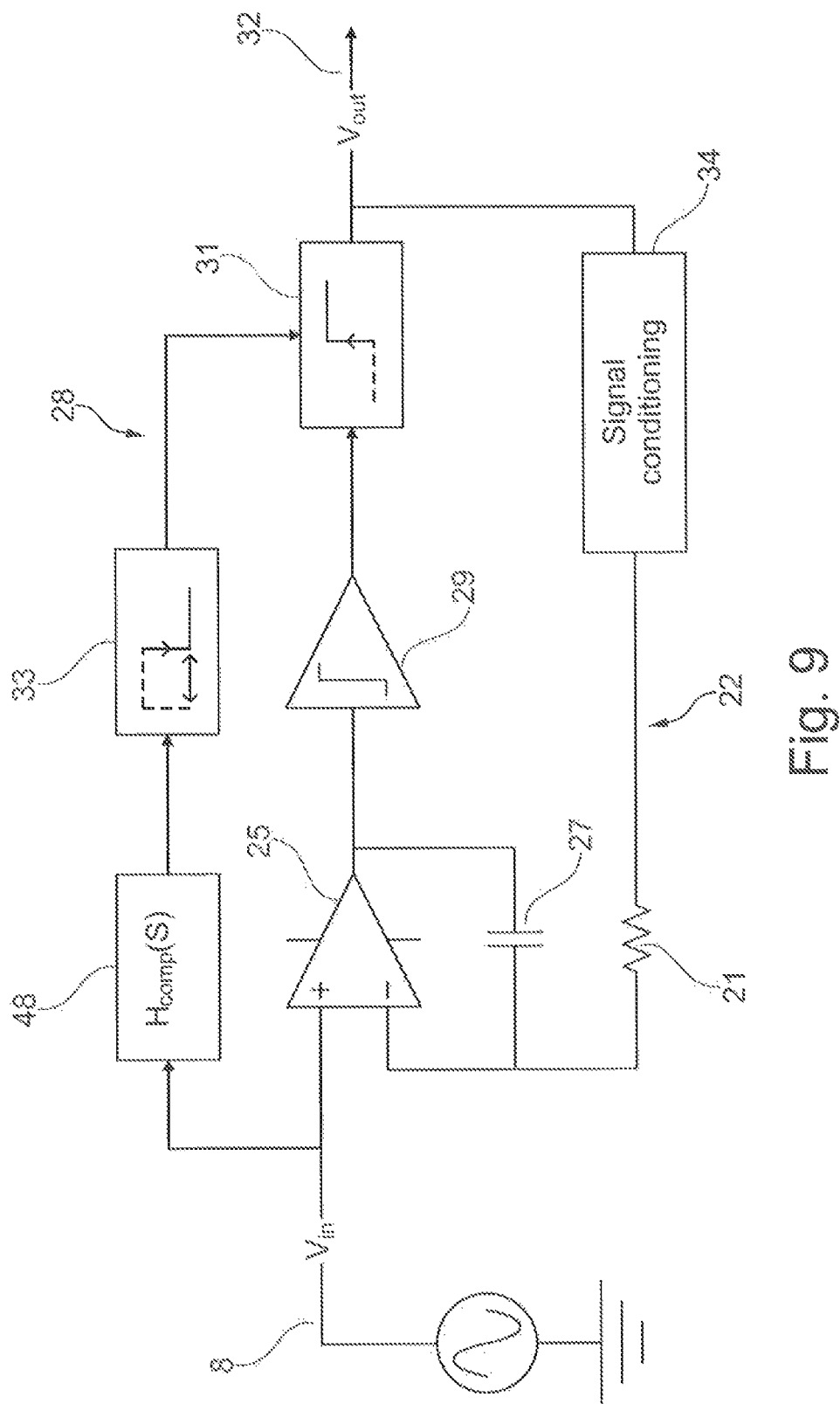
FIG. 9 discloses a feed-forward path phase compensation of the non-inverting composite phase modulator.

FIG. 9 discloses the feed-forward path phase compensation of the non-inverting composite phase modulator. In FIG. 9, the phase compensation device 48 is indicated just as it is indicated in FIG. 7.

Figure 10:
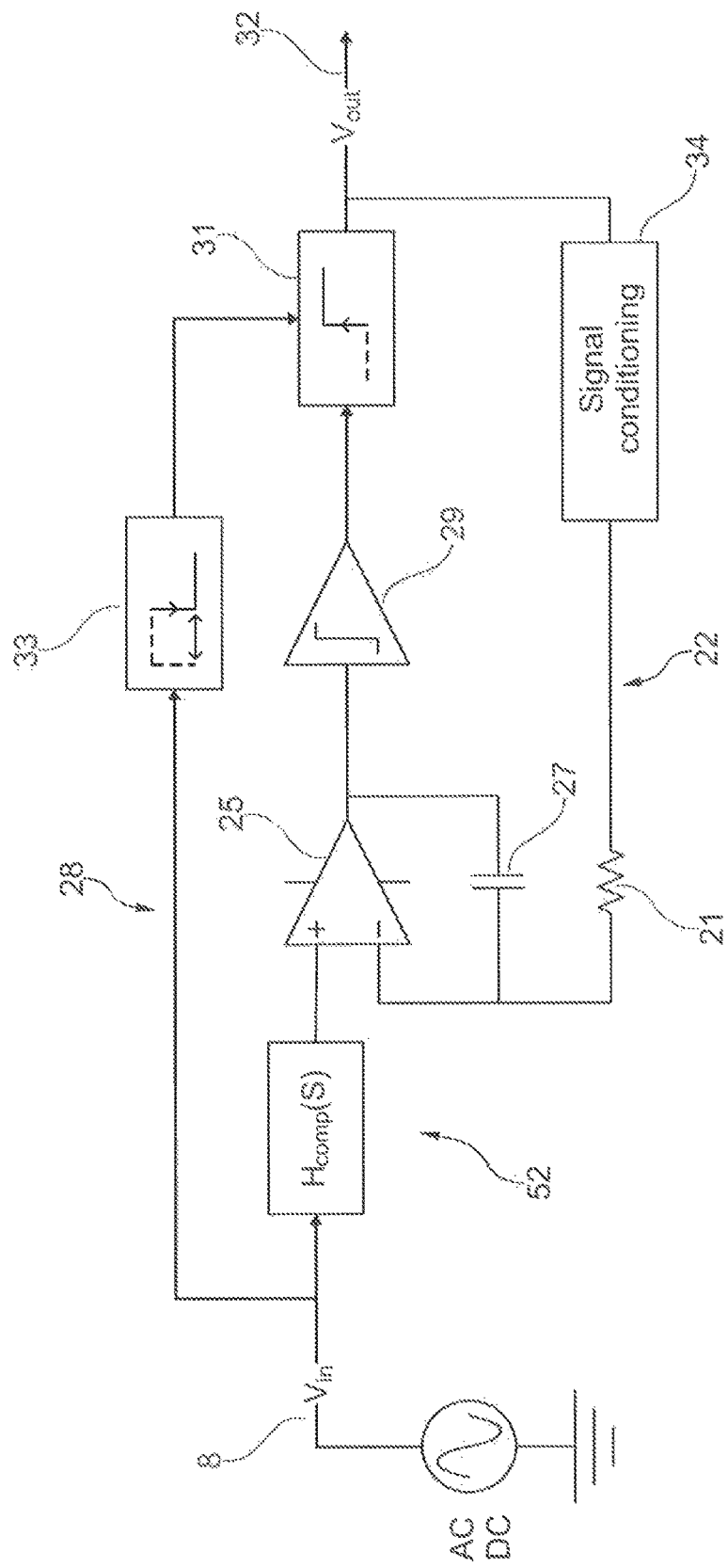
FIG. 10 discloses a possible embodiment for a feedback path phase compensation of the non-inverting composite phase modulator.

FIG. 10 discloses a feedback path 22 phase compensation of the non-inverting composite phase modulator 52. Thus FIG. 10 discloses almost the same embodiment as the one shown in FIG. 8.

Figure 11:
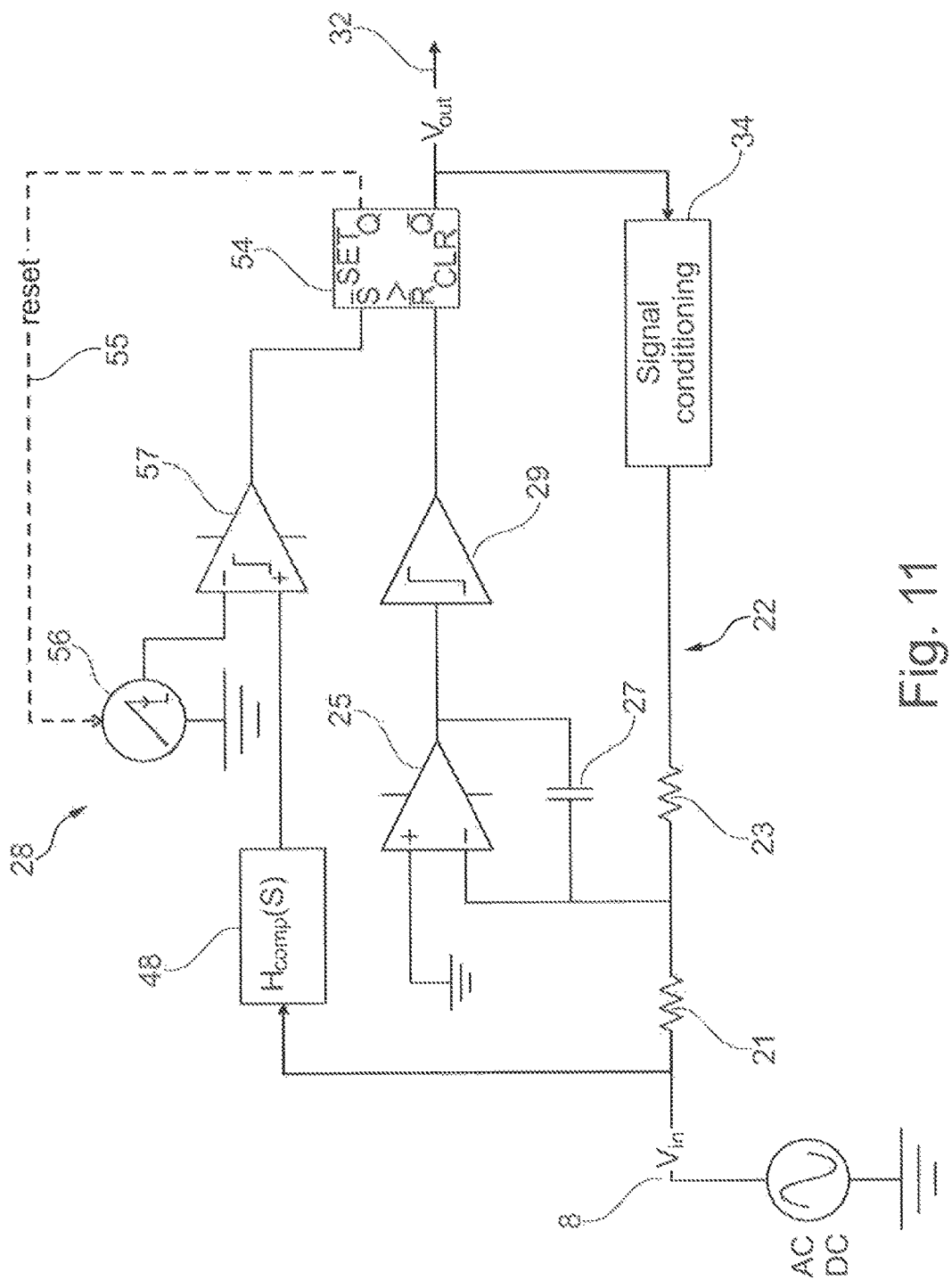
FIG. 11 discloses a possible embodiment for an inverting composite phase modulator.

FIG. 11 discloses an inverting composite phase modulator. The feed-forward loop 28 is now placed in an SR-latch 54 which is connected to a comparator 57, which comparator 57 has a positive input receiving the signal from the phase compensation device 48. Instead the negative input is connected to a ramp generator 56. This ramp generator is controlled by a reset pulse 55 generated by the SR-latch 54.

Figure 12:
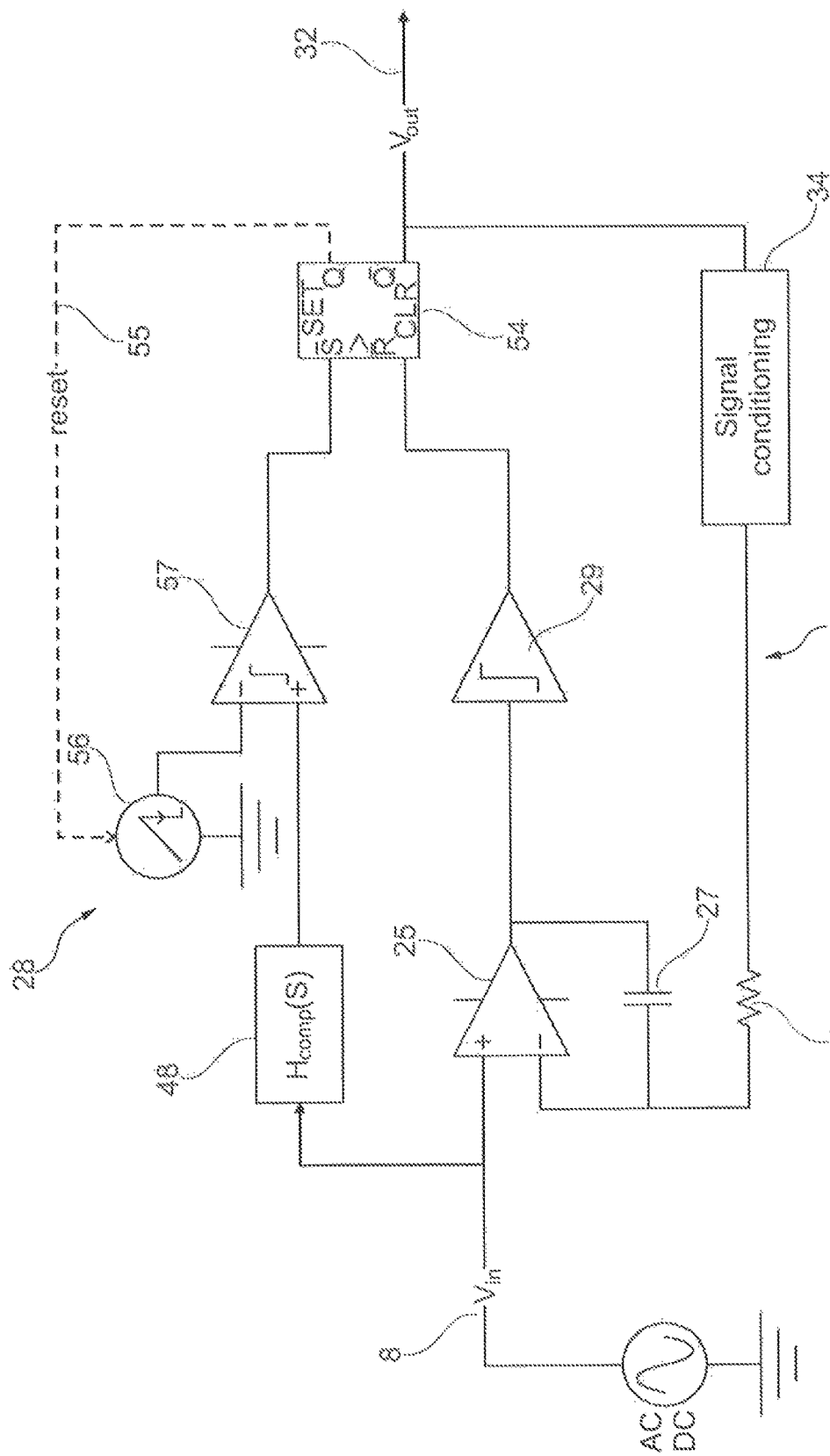
FIG. 12 discloses a non-inverting composite phase modulator.

FIG. 12 discloses almost the same embodiment as the one shown in FIG. 11, but now it is a non-inverting composite phase modulator.

Figure 13:
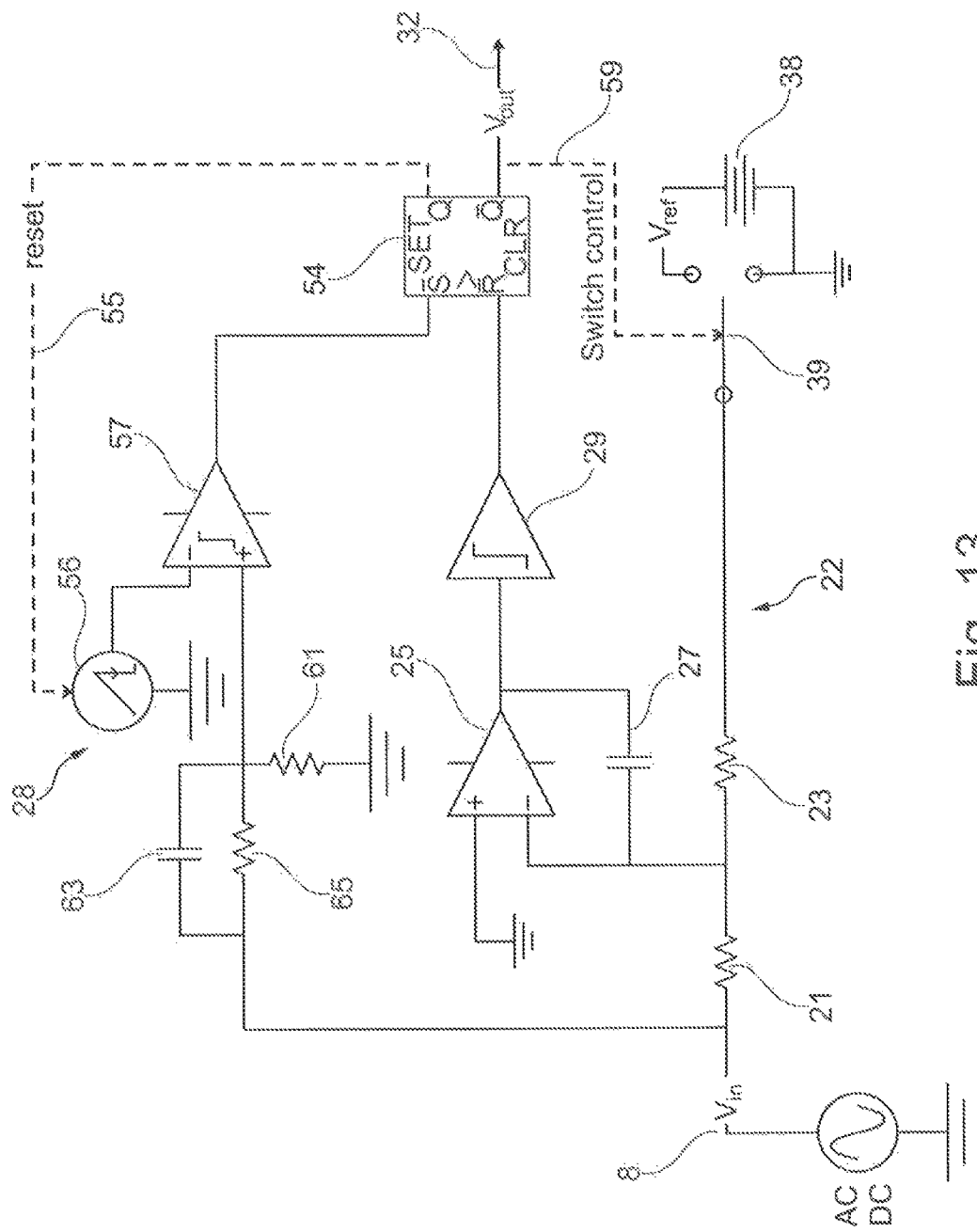
FIG. 13 discloses an inverting composite phase modulator.

FIG. 13 discloses an inverting composite phase modulator implementation example. FIG. 13 discloses the switch control as already disclosed in FIG. 5 in combination with FIG. 11.

Figure 14:
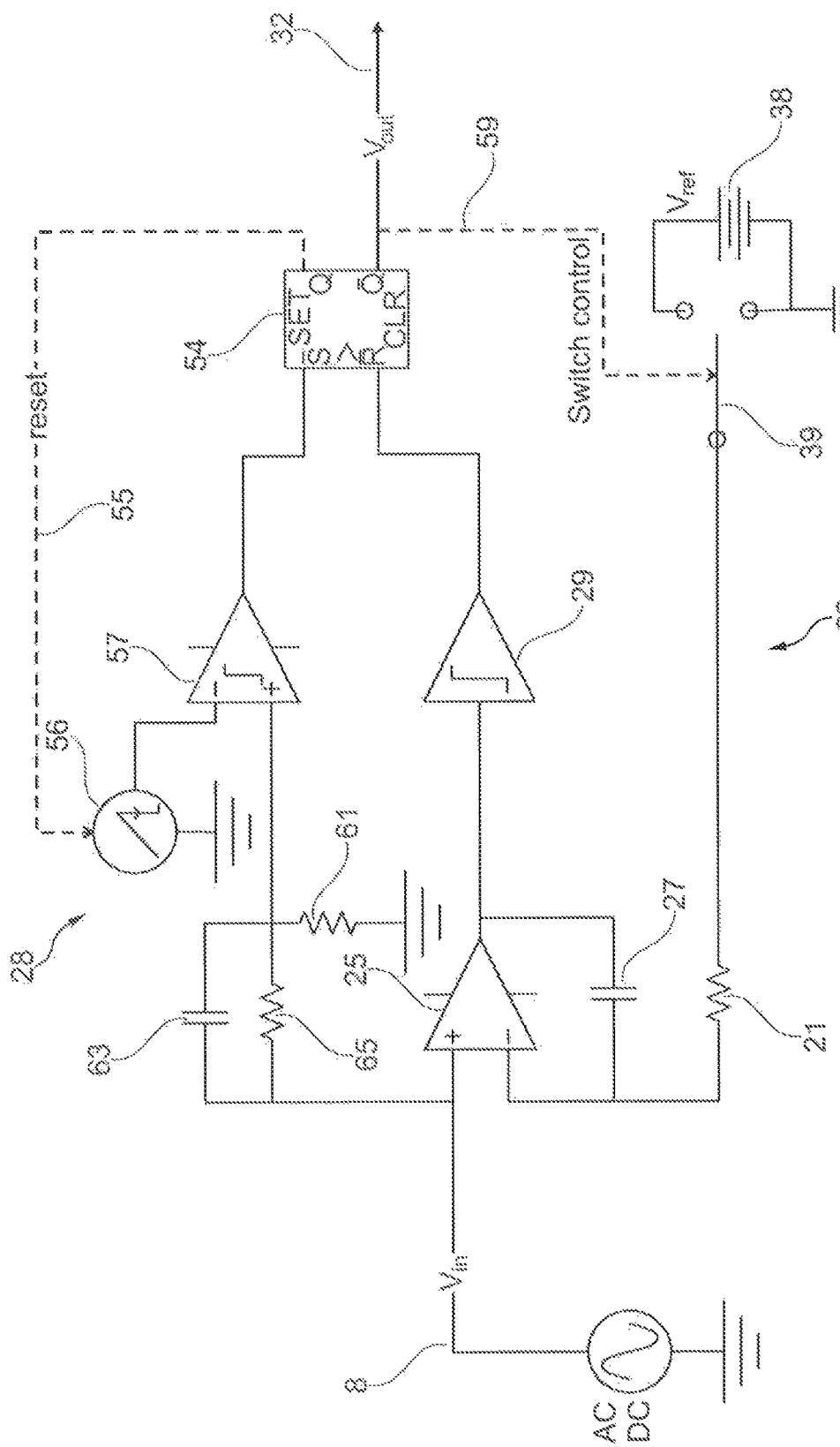
FIG. 14 discloses one possible embodiment for a non-inverting composite phase modulator.

FIG. 14 discloses instead the non-inverting composite phase modulator. FIG. 14 is therefore also a combination of what has already been disclosed in FIG. 5 and FIG. 11.

Figure 15:
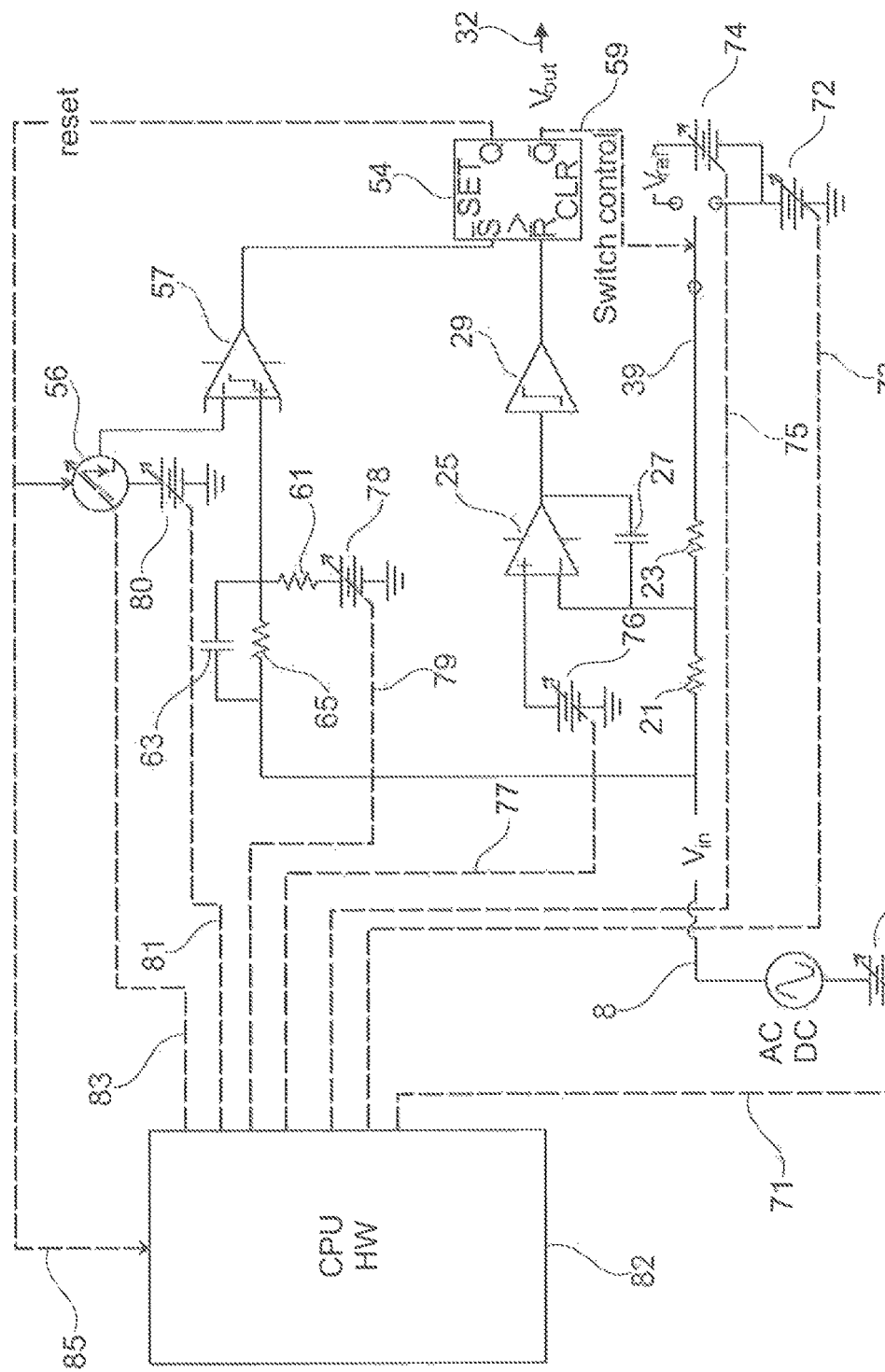
FIG. 15 discloses a regulation and linearization scheme.

FIG. 15 discloses regulation and linearization of the system as disclosed in the previous figures. A central processing unit CPU 82 controls a number of DC power supplies for generating a controllable bias. Therefore a power supply 70 is connected to give a controllable DC level to the continuous input signal. This power supply 70 is controlled by a line 71 which is coming from the CPU 82. Further there is shown the power supply 38 (FIG. 14) which generates the feedback loop to two independently controllable power supplies 72 and 74 which are now separate. Both of these power supplies are controlling lines 73 and 75. Further there is indicated a DC source 76, which is giving a DC bias at the positive input of the operational amplifier 25. This power supply 76 is controlled by a control line 77. Further there is indicated a controllable DC source 78 which is controlled by a control line 79. The output of this power source 78 is connected to a continuous filter comprising a resistor 61, a capacitor 63, and a further resistor 65; the output of this filter is connected to the positive input of the comparator 57. Further there is indicated a DC source 80 which is controlled by a line 81, which is controlling the reference voltage to the ramp generator 56. The ramp generator 56 is connected to the CPU over a line 83 so also the ramp generator is under control from the CPU. Further there is indicated a reset line 85 going from the SR-latch output Q towards the ramp generator 56 and further towards the CPU.

By inserting controllable voltage sources (70,72,74,76, 78,80) it is possible to calibrate offset, gain and tuning of oscillation frequency. In that way the circuit can be compensated for in non-linear components because the CPU can contain a program which can allow for e.g. temperature change or voltage change in the components, so by changing the DC levels, a component can be more linear than what it would normally have been. In this way a highly efficient continuous to discontinuous conversion can be performed.

Figure 16:
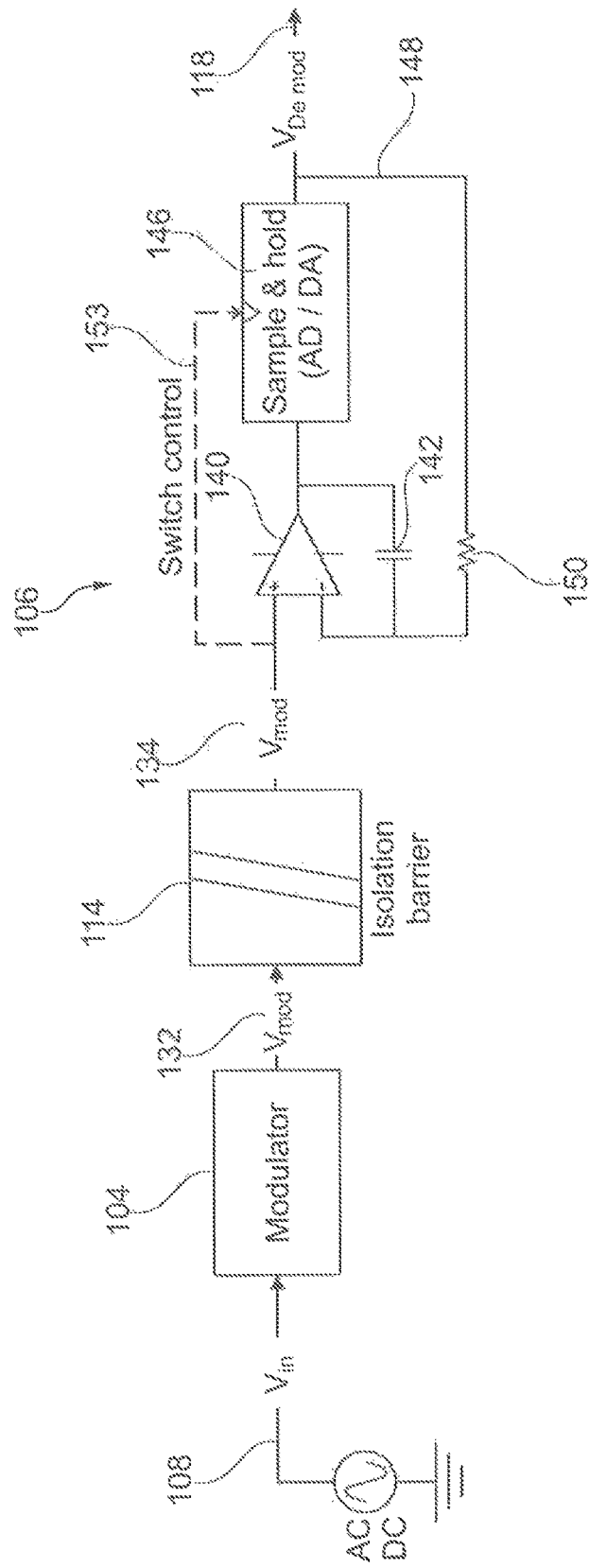
FIG. 16 discloses one possible embodiment for a demodulator.

FIG. 16 discloses a demodulator which comprises at first a discontinuous input line 134 which is sent to the positive terminal of an operational amplifier 140, which operational amplifier 140 together with a feedback capacitor 142 forms an integrator. The output from the operational amplifier 140 is sent to a sample-hold circuitry 146 where the outlet from this sample-hold circuitry forms 118 the continuous output. Further there is indicated a feedback 148 to a resistor 150 to the negative input of the operational amplifier 140. Further there is indicated a switch control starting at the discontinuous input 134 and sent to the sample-hold circuitry 146 for synchronization. Hereby a fast operating discontinuous to continuous conversion is achieved.

Figure 17:
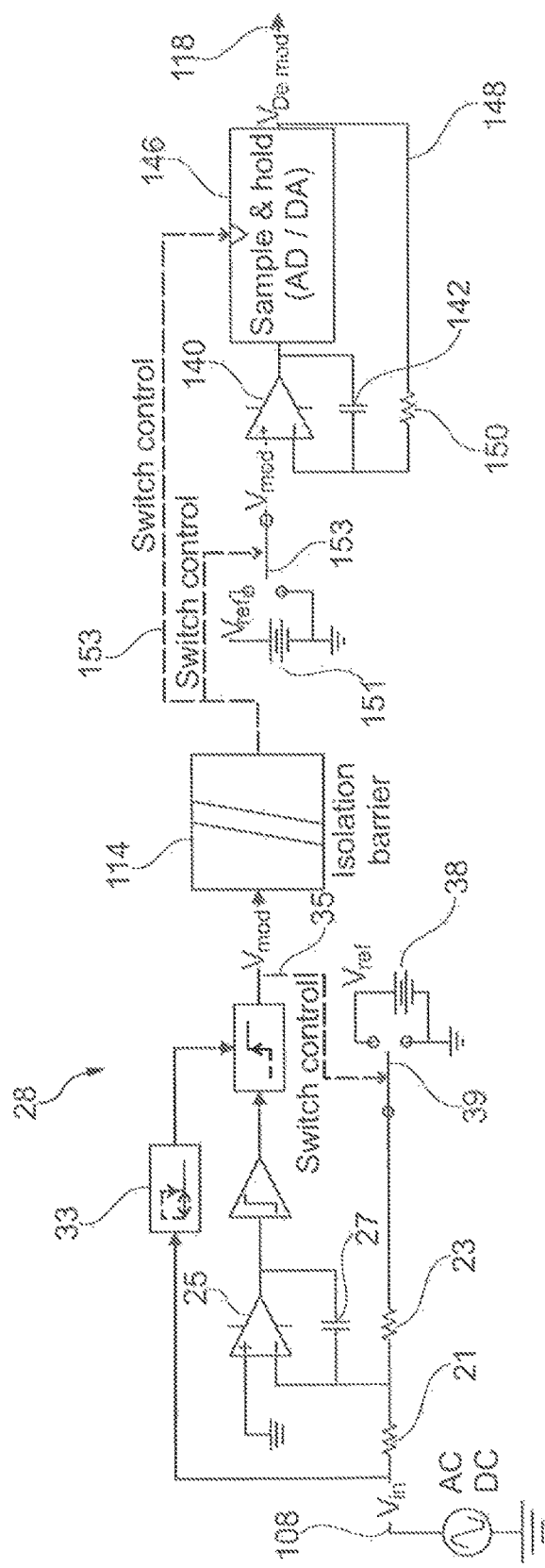
FIG. 17 discloses a possible embodiment for modulator and demodulator width-optimized linearity.

FIG. 17 discloses a modulator and demodulator width-optimized linearity. The modulator of FIG. 17 is more or less identical to the modulator seen in FIG. 5 where the demodulator instead comprises a switch control, a DC source 151, and a switch 152 that switches between the DC levels of the DC source 151 forming the input at the operational amplifier 140. Hereby it is achieved that only the switching is used from the signal coming at the discontinuous input 153. The data content of this line is comprises the changes from low to high or from high to low, which changes are used for switching control.

Figure 18:
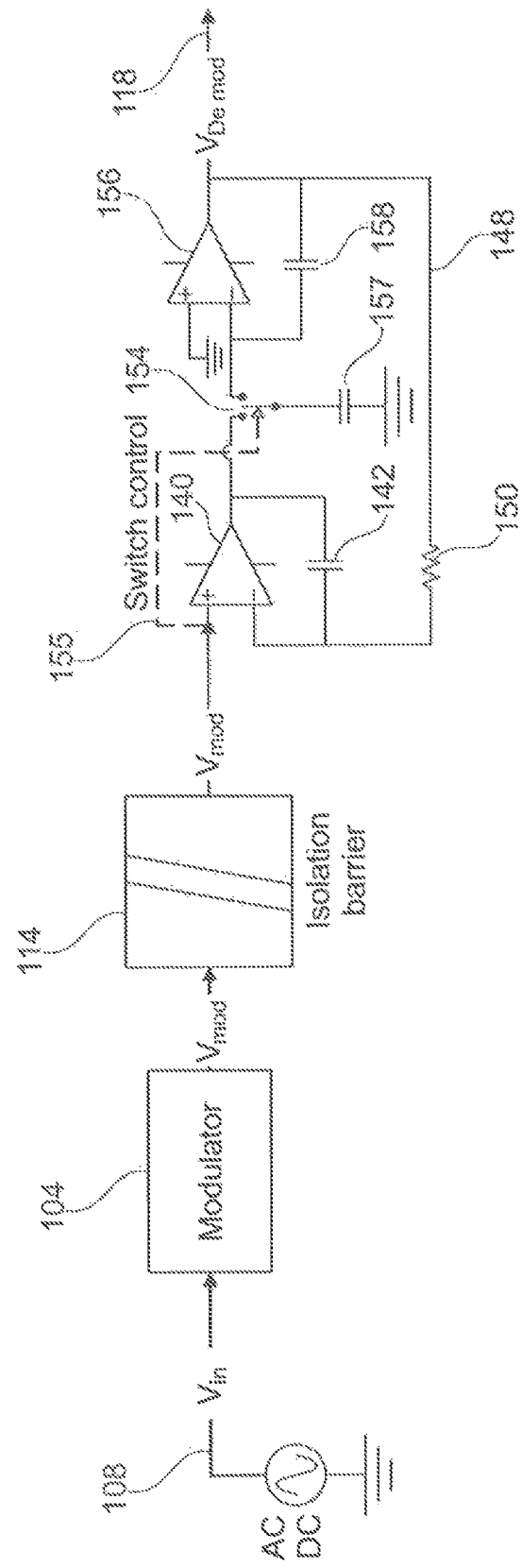
FIG. 18 discloses implementation of self-clocked demodulator.

FIG. 18 discloses an example of a self-clocked demodulator. A switch 154 switches between output from the operational amplifier 140 and lets the output from this operational amplifier be sent to a capacitor 157. In the opposite position of the switch 154, the charge of the capacitor 157 is sent to the negative input of the operational amplifier 156. A feedback is indicated with a resistor 150 as previously disclosed. In this way it is achieved that the only forward communication of signals is made by the charging of the capacitor 157. In this way it is ensured that no high-frequency signals can be sent from the first integrator to the second integrator.

Figure 19:
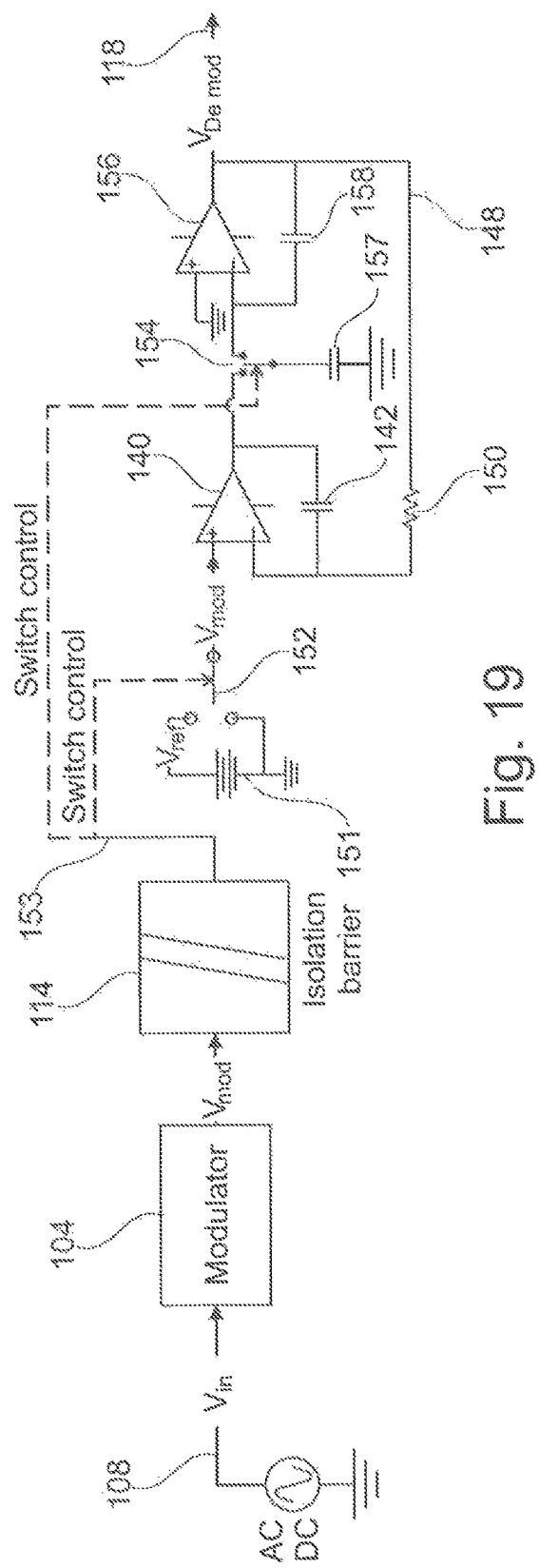
FIG. 19 discloses a possible implementation of self-clocked demodulator width-optimized linearity.

FIG. 19 discloses a self-clocked demodulator with optimized linearity. FIG. 19 shows a combination of the two different technologies indicated in FIG. 17 and FIG. 18 in combination; therefore FIG. 19 is not further described here.

Figure 20:
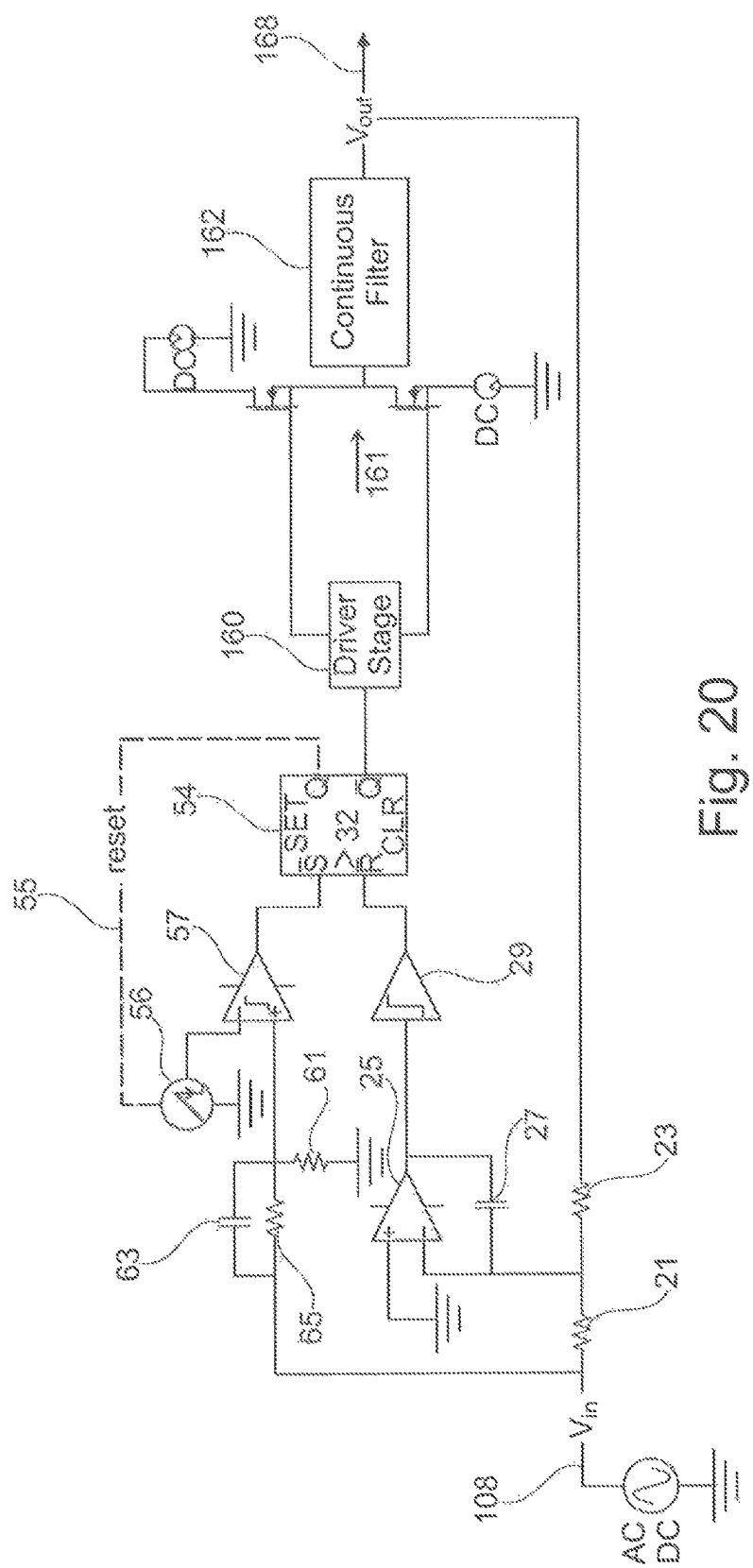
FIG. 20 discloses a possible implementation of a self-oscillating class D power amplifier.

FIG. 20 discloses a composite phase modulator similar to the one shown in FIG. 13 which is combined with a class D power section (160,161) to implement a self-oscillating class D power amplifier connected to the analog output through a continuous filter 162.

The invention claimed is:

1. A system for modulation and demodulation of a continuous input signal, which system is configured to receive a continuous input and by a modulator to generate a modulated discontinuous signal, which system further comprises a demodulator for generating a continuous output, wherein the modulator is formed as a composite phase modulator, which composite phase modulator comprises at least a feedback loop which feedback loop determines a pulse width of a low-level discontinuous discrete signal, which composite phase modulator further comprises at least a feed-forward loop, which feed-forward loop (28) determines the pulse width of a high-level discontinuous discrete signal as a function of the continuous input which combination of the feedback loop and feed-forward loop ensures a self-oscillating phase-modulator; and wherein the continuous input is passing a sample and hold circuit eliminating non-linearities and distortion.

2. The system according to claim 1, wherein the system comprises a galvanic isolation between the modulator and the demodulator.

3. The system according to claim 1, wherein the feedback loop comprises a signal condition circuit.

4. The system according to claim 3, wherein a negative input at an integrator forms a summing point for the continuous input and the feedback regulation loop for forming an inverting pulse width modulator.

5. The system according to claim 4, wherein the signal condition circuit is formed by use of the discontinuous output signal to control a switch, which switch switches between a high and a low level of a high-precision voltage reference.

6. The system according to claim 5, wherein feed-forward circuitry comprises a feed-forward path phase compensation of the inverting composite phase modulator.

7. The system according to claim 5, wherein the feedback regulation loop comprises a path phase compensation of the inverting composite phase modulator.

8. The system according to claim 4, wherein the feed-forward loop comprises a feed-forward path phase compensation of the non-inverting composite phase modulator.

9. The system according to claim 4, wherein the feedback regulation loop comprises a feedback path phase compensation of the non-inverting composite phase modulator.

10. The system according to claim 3, wherein the feed-forward loop comprises an SR-latch as control logic to interpret the pulse and pause width control signals, which pulse width is determined by comparing the continuous input signal with a constant slope signal voltage ramp generator, which voltage ramp generator is initiated by the pause regulation loop when the value of the slope matches the input voltage, and the output of the comparator is used to end the pulse and start the pause while also resetting the voltage ramp generator.

11. The system according to claim 1, wherein a microprocessor performs actual control of a plurality of voltage reference sources.

12. The system according to claim 1, wherein the demodulator is based on an integrator and a sample-hold circuitry for generating a continuous out-put signal.

13. The system according to claim 12, wherein the demodulator circuitry comprises a switch, which switch switches between a high and a low level of a second high-precision voltage reference.

14. The system according to claim 12, wherein the sample-hold circuitry comprises a further integrator, from which integrator a feedback signal is connected to the negative input at the integrator, which integrator has an output connected to a first terminal of a switch, which integrator has a negative input connected to a second terminal of the switch, which switch comprises a third terminal connected through a capacitor to ground.

15. The system according to claim 1, wherein the composite phase modulator facilitating the pulse-width modulated signal is combined with a power switching circuitry to form a self-oscillating class D amplifier.

16. A method for converting a continuous signal to a pulse width modulation based on the continuous input signal, as disclosed in claim 11, and for transmitting the pulse width for converting the pulse width signal from the isolation barrier by a demodulation circuit into a continuous output signal.

17. The system of claim 1, wherein the self-oscillating phase-modulator is a pulse-width modulated discontinuous signals modulator with a stable pulse-width modulated discontinuous signals modulation/sampling frequency, and which is independent of the frequency content and amplitude of the continuous input signal.

18. A system for modulation and demodulation of a continuous input signal, which system is configured to receive a continuous input and by a modulator to generate a modulated discontinuous signal, which system further comprises a demodulator for generating a continuous output, wherein the modulator is formed as a composite phase modulator, which composite phase modulator comprises at least a feedback loop which feedback loop determines a pulse width of a low-level discontinuous discrete signal, which composite phase modulator further comprises at least a feed-forward loop, which feed-forward loop (28) determines the pulse width of a high-level discontinuous discrete signal as a function of the continuous input which combination of the feedback loop and feed-forward loop ensures a self-oscillating phase-modulator; and wherein the feedback loop comprises a signal condition circuit.

19. A system for modulation and demodulation of a continuous input signal, which system is configured to receive a continuous input and by a modulator to generate a modulated discontinuous signal, which system further comprises a demodulator for generating a continuous output, wherein the modulator is formed as a composite phase modulator, which composite phase modulator comprises at least a feedback loop which feedback loop determines a pulse width of a low-level discontinuous discrete signal, which composite phase modulator further comprises at least a feed-forward loop, which feed-forward loop (28) determines the pulse width of a high-level discontinuous discrete signal as a function of the continuous input which combination of the feedback loop and feed-forward loop ensures a self-oscillating phase-modulator; and wherein a microprocessor performs actual control of a plurality of voltage reference sources.

* * * * *